United States Patent
Ma et al.

(10) Patent No.: US 9,563,238 B2
(45) Date of Patent: Feb. 7, 2017

(54) FIXING MEMBER AND ELECTRONIC DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Wei-Yong Ma, Wuhan (CN); Da-Long Sun, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 27 days.

(21) Appl. No.: 14/789,219

(22) Filed: Jul. 1, 2015

(65) Prior Publication Data

US 2016/0363259 A1  Dec. 15, 2016

(30) Foreign Application Priority Data

Jun. 15, 2015 (CN) .......................... 2015 1 0326127

(51) Int. Cl.
*G06F 1/18* (2006.01)
*F16M 13/02* (2006.01)
*H05K 7/14* (2006.01)
*H05K 1/14* (2006.01)

(52) U.S. Cl.
CPC .............. *G06F 1/184* (2013.01); *F16M 13/02* (2013.01); *G06F 1/183* (2013.01); *H05K 7/1417* (2013.01); *H05K 1/142* (2013.01); *H05K 7/1408* (2013.01)

(58) Field of Classification Search
CPC .. H05K 7/1408; H05K 7/1409; H05K 7/1417; G06F 1/185; G06F 1/184; G06F 1/186; F16M 13/02
See application file for complete search history.

(56) References Cited

U.S. PATENT DOCUMENTS

| | | | | |
|---|---|---|---|---|
| 8,520,398 B2* | 8/2013 | Zhao | ...................... | H05K 7/142 361/719 |
| 8,824,157 B2* | 9/2014 | Fan | .......................... | G06F 1/186 248/674 |
| 2004/0125576 A1* | 7/2004 | Lin | .......................... | G06F 1/184 361/759 |
| 2004/0223298 A1* | 11/2004 | Chen | ...................... | G06F 1/188 361/679.01 |
| 2007/0279884 A1* | 12/2007 | Hardt | .................... | H05K 7/1487 361/796 |
| 2012/0320511 A1* | 12/2012 | Tan | ......................... | G06F 1/186 361/679.4 |

* cited by examiner

*Primary Examiner* — Adrian S Wilson
*Assistant Examiner* — Abhishek Rathod
(74) *Attorney, Agent, or Firm* — Zhigang Ma

(57) ABSTRACT

A fixing member is used for fixing a plate to a frame. The fixing member includes a body and a fixing plate extending from the body. The body can lock with the frame along a first direction substantially parallel to the body. The fixing plate is configured to deform along a second direction substantially perpendicular to the first direction and lock with an aligning portion of the plate. An electronic device is also provided.

17 Claims, 7 Drawing Sheets

FIXING MEMBER AND ELECTRONIC DEVICE

CROSS-REFERENCE TO RELATED APPLICATIONS

This application claims priority to Chinese Patent Application No. 201510326127.7 filed on Jun. 15, 2015, the contents of which are incorporated by reference herein.

FIELD

The subject matter herein generally relates to a fixing member and an electronic device with the fixing member.

BACKGROUND

Electronic devices such as flat screen displays are widely used because of their portability. The flat screen displays include fixing members for fixing one or more components to each other. When the flat screen displays need to be repaired, the components need to be removed conveniently.

BRIEF DESCRIPTION OF THE DRAWINGS

Implementations of the present technology will now be described, by way of example only, with reference to the attached figures.

DETAILED DESCRIPTION

Figure 1:
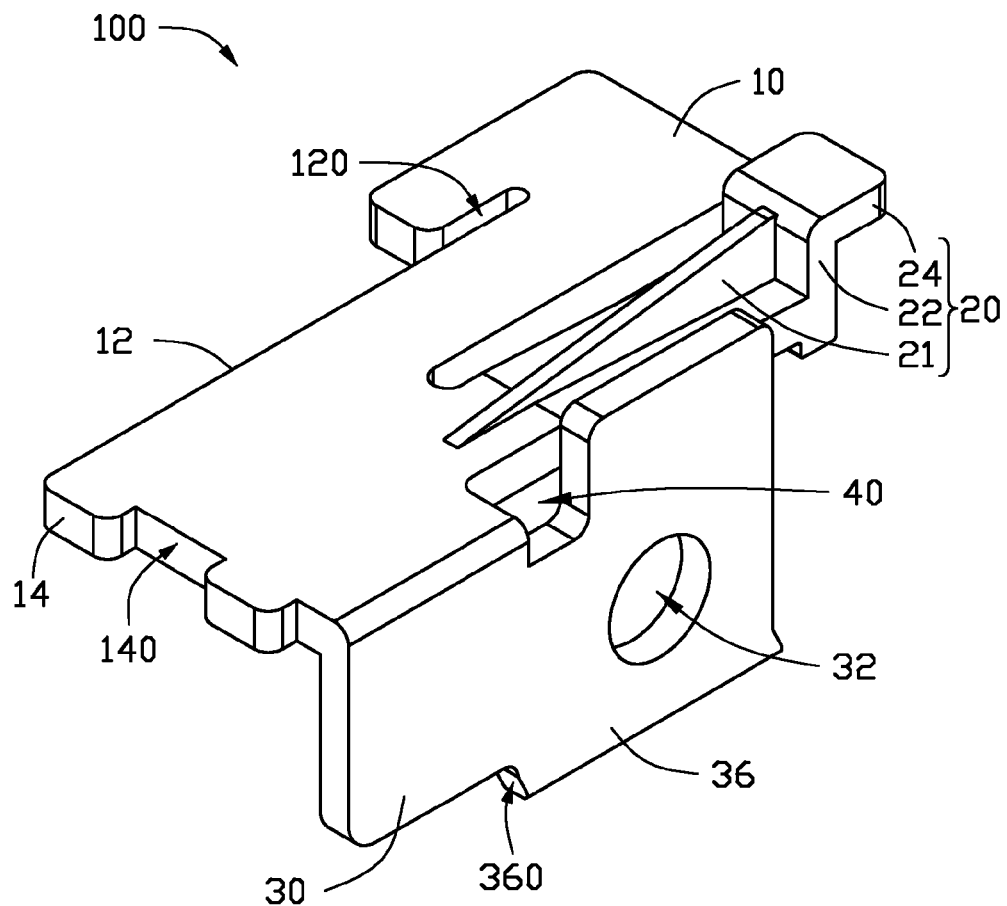
FIG. 1 is an isometric view of one embodiment of a fixing member.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

The present disclosure is described in relation to an electronic device. The electronic device includes a fixing member, a plate, and a frame. The fixing member is used for fixing the plate to the frame. The fixing member includes a body and a fixing plate extending from the body. The body can lock with the frame along a first direction substantially parallel to the body. The fixing plate is configured to deform along a second direction substantially perpendicular to the first direction and lock with an aligning portion of the plate. An electronic device is also provided.

Figure 2:
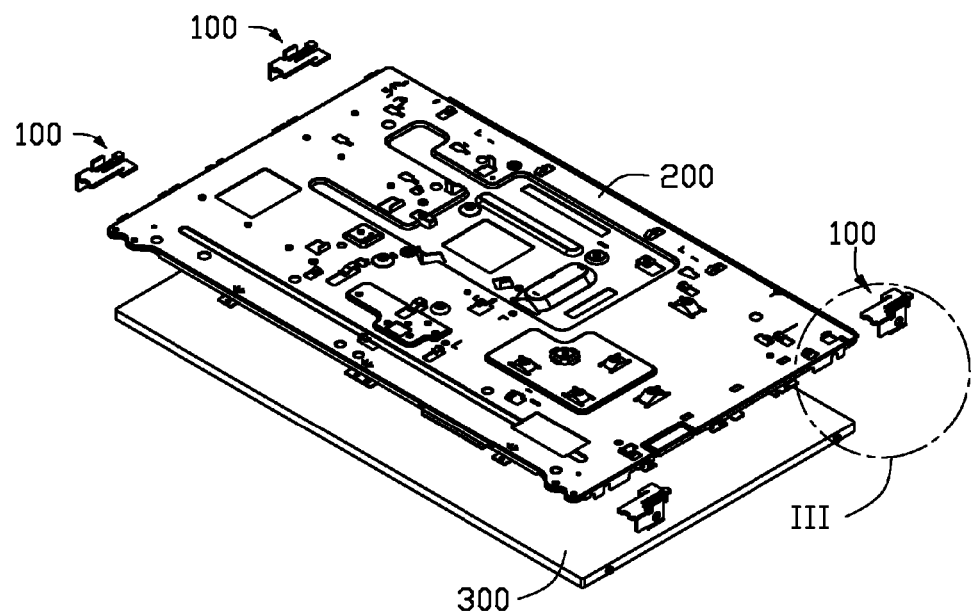
FIG. 2 is an exploded, isometric view of an electronic device with the fixing member of FIG. 1.
Figure 3:
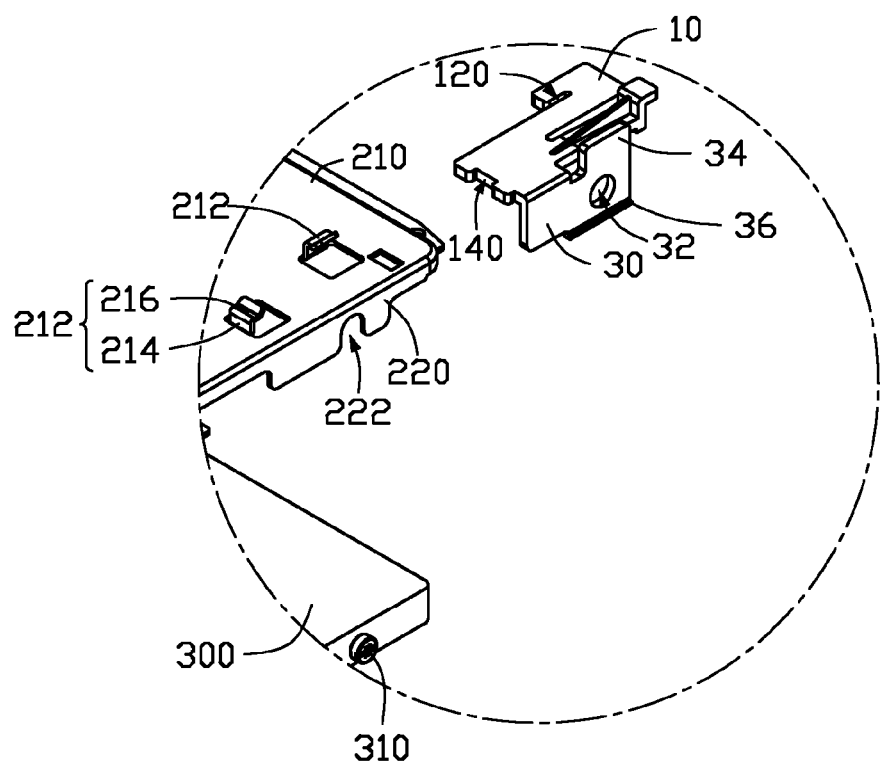
FIG. 3 is an enlarged view of a circled portion III of FIG. 2.

FIGS. 1-3 illustrate one embodiment of an electronic device. The electronic device includes a fixing member 100, a frame 200 and a plate 300. The frame 200 is fixed to the plate 300 via the fixing member 100.

The fixing member 100 includes a body 10, an operation portion 20 extending from the body 10, and a fixing plate 30 extending from the body 10. The fixing plate 30 can be substantially perpendicular to the body 10. A gap 40 is defined between the body 10 and the fixing plate 30. The fixing plate 30 can be deformable along a direction perpendicular to the fixing plate 30 via the gap 40. The body 10 includes a first side 12 and a second side 14 substantially perpendicular to the first side 12. The first side 12 defines a groove 120. The second side 14 defines a notch 140. The operation portion 20 includes a reinforcing rib 21 extending from the body 10, a connecting piece 22, and a tab 24 extending from the connecting piece 22. The tab 24 can be substantially parallel to the body 10 and substantially perpendicular to the connecting piece 22 and the fixing plate 30. In one embodiment, the body 10 can be a rectangle. The reinforcing rib 21 can be a triangle. The operation portion 20 is located on a corner of the body 10.

The fixing plate 30 defines an aligning hole 32. An operation piece 34 extends from one first end of the fixing plate 30. A guiding portion 36 extends from one second end opposite to the first end of the fixing plate 30. The guiding portion 36 includes a guiding surface 360 extending towards the gap 40. In one embodiment, the guiding surface 360 is a slanted surface.

The frame 200 includes a main portion 210 and four flanges 220 extending from the main portion 210. Each flange 220 can be substantially perpendicular to the main portion 210. In one embodiment, the frame 200 can be a rectangle. The four flanges 220 are located on four corners of the main portion 210. The main portion 210 includes two locking pieces 212 perpendicular to each other. Each locking piece 212 includes a locking portion 214 and a stopper portion 216 extending from the locking portion 214. The stopper portion 216 can be substantially perpendicular to the locking portion 214. Each flange 220 defines a cutout 222. In one embodiment, the cutout 222 can be arch shaped. The plate 300 includes four aligning portions 310. The plate 300 can be a rectangle. The four aligning portions 310 are located on the four corners of the plate 300. In one embodiment, each aligning portion 310 is one end of a screw for fixing the plate 300.

Figure 4:
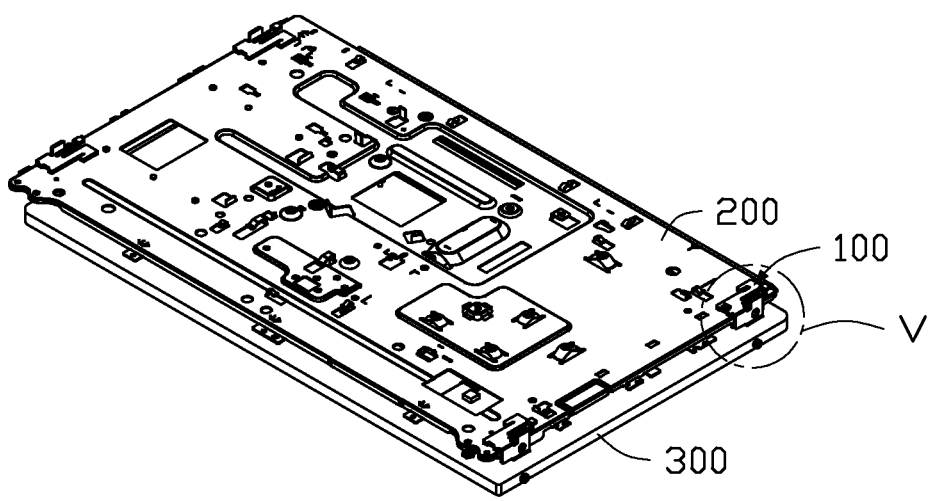
FIG. 4 is an exploded, isometric view of the electronic device of FIG. 2.
Figure 5:
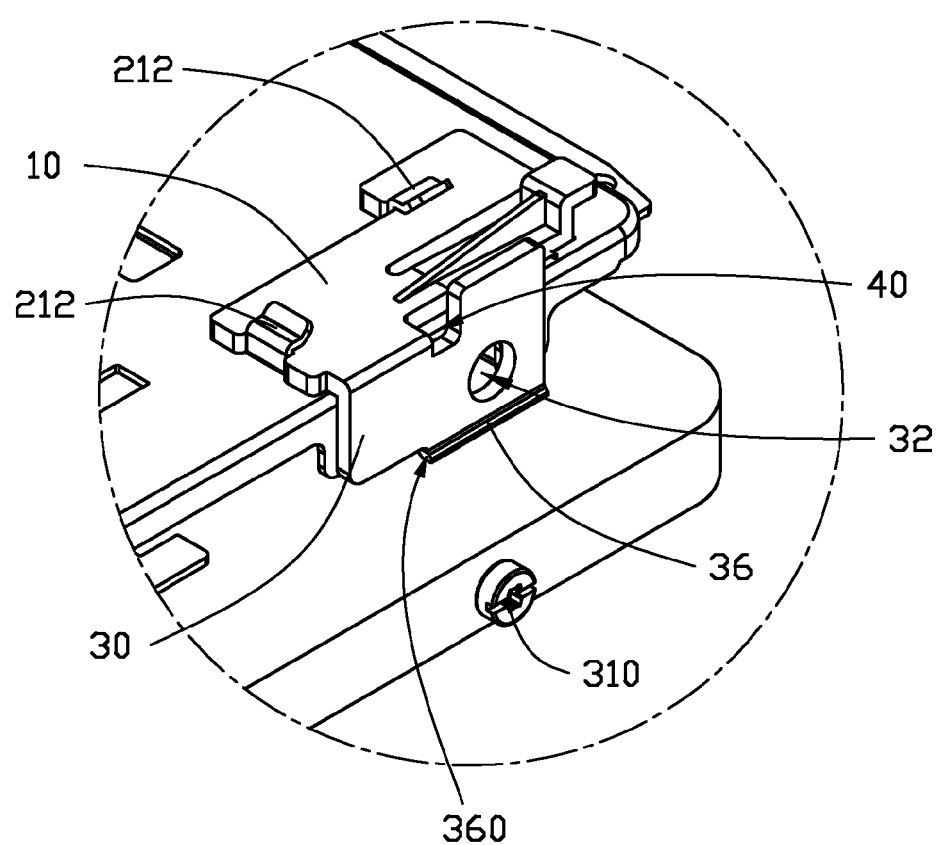
FIG. 5 is an enlarged view of a circled portion V of FIG. 4.

FIGS. 4-5 illustrate isometric views of the fixing member 100 fixed to the frame 200. The body 10 is moved towards a first direction until one of the two locking pieces 212 are received in the groove 120. Another locking piece 212 abuts the notch 140 to fix the body 10 to the frame 200. The first direction can be substantially parallel to the body 10.

Figure 6:
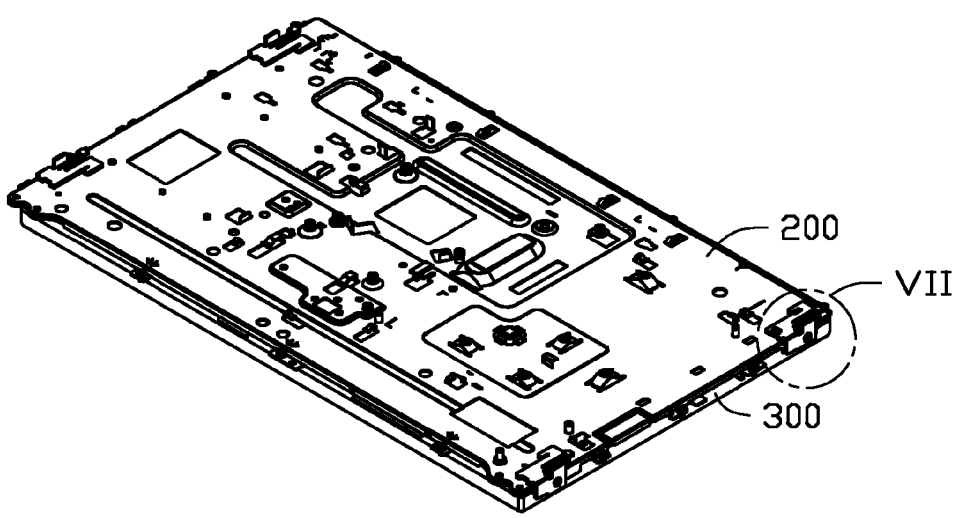
FIG. 6 is an assembled, isometric view of the electronic device of FIG. 2.
Figure 7:
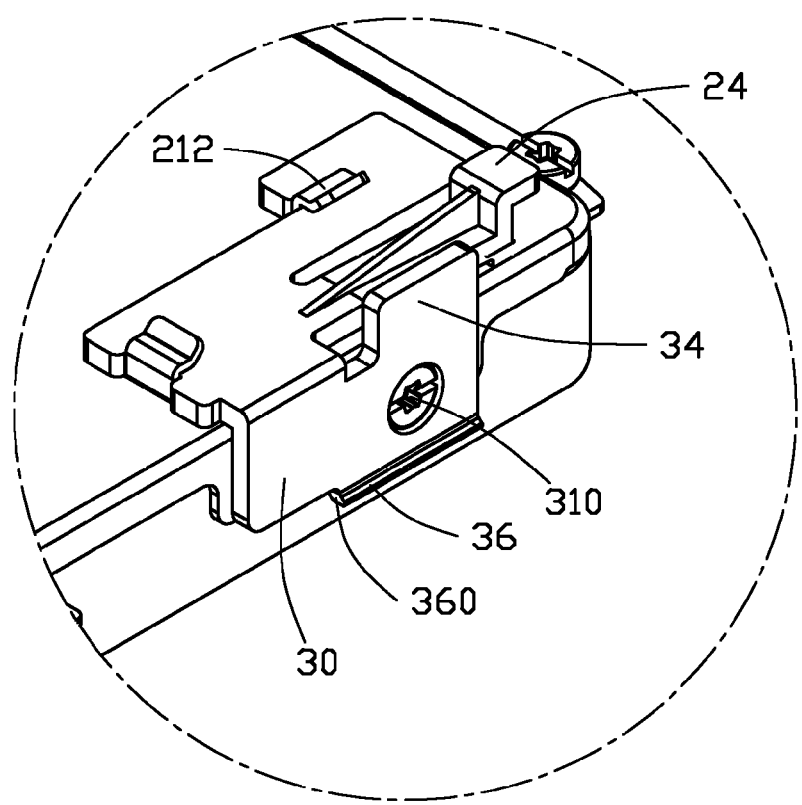
FIG. 7 is an enlarged view of a circled portion of FIG. 6.

FIGS. 6-7 illustrate isometric views of the fixing member 100 fixed to the plate 300. Each aligning portion 310 is slid into the cutout 222 along the guiding portion 36 to align the plate 300 with the frame 200. Each aligning hole 32 is engaged with the each aligning portion 310 to fix the plate 300 to the frame 200.

When the electronic device needs to be repaired, the operation piece 34 is forced to deform along a second direction. The second direction can be substantially perpendicular to the first direction. The aligning hole 32 is removed from the aligning portion 310. The plate 300 and the frame 200 are unlocked and separated from each other. The tab 24 is forced to move along a direction opposite to the first direction. The fixing member 100 and the frame 200 are unlocked and separated from each other.

The embodiments shown and described above are only examples. Many details are often found in the art such as the other features of the electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A fixing member for a plate and a frame comprising:
   a body;
   a fixing plate extending from the body;
   wherein the body is configured to lock to the frame along a first direction substantially parallel to the body, and the fixing plate is configured to deform along a second direction substantially perpendicular to the first direction and is locked to an aligning portion of the plate; and
   wherein the body comprises a first side and a second side substantially perpendicular to the first side, the first side defines a groove, the second side defines a notch, and the groove and the notch are engaged with two locking pieces.

2. The fixing member of claim 1, wherein the fixing plate comprises a guiding portion and defines an aligning hole, and the aligning portion is slid into the aligning hole along the guiding portion to fix the fixing plate and the plate.

3. The fixing member of claim 2, wherein the guiding portion comprises a guiding surface, and the guiding surface is a slanted surface.

4. The fixing member of claim 2, wherein an operation piece extends from one end of the fixing plate opposite to the guiding portion, and the operation piece is forced to move along the second direction.

5. The fixing member of claim 1, wherein a gap is defined between the body and the fixing plate, and the fixing plate is moveable towards the gap to be deformable along a direction perpendicular to the fixing plate.

6. The fixing member of claim 1, wherein the fixing plate is substantially perpendicular to the body.

7. The fixing member of claim 1 further comprising an operation portion, wherein the operation portion comprises a connecting piece extending from the body and a tab extending from the connecting piece, and the tab is substantially perpendicular to the connecting piece.

8. The fixing member of claim 7, wherein the operation portion further comprises a reinforcing rib, the reinforcing rib is a triangle, and two connecting sides of the reinforcing rib are connected to the body and the connecting piece.

9. An electronic device comprising:
   a fixing member comprising a body and a fixing plate extending from the body, and the fixing plate comprising a guiding portion;
   a plate comprising an aligning portion;
   a frame comprising at least one locking piece;
   wherein the body is configured to lock to the at least one locking piece along a first direction substantially parallel to the body, the fixing plate is configured to deform along a second direction substantially perpendicular to the first direction, and the aligning portion is slide along the guiding portion until locked to the fixing plate; and
   wherein the body comprises a first side and a second side substantially perpendicular to the first side, the first side defines a groove, the second side defines a notch, the at least one locking piece comprises two locking pieces, and the groove and the notch are engaged with the two locking pieces.

10. The electronic device of claim 9, wherein the fixing plate defines an aligning hole, and the aligning portion is slid into the aligning hole along the guiding portion to fix the fixing plate and the plate.

11. The electronic device of claim 10, wherein the guiding portion comprises a guiding surface, and the guiding surface is a slanted surface.

12. The electronic device claim 9, wherein an operation piece extends from one end of the fixing plate opposite to the guiding portion, and the operation piece is forced to move along the second direction.

13. The electronic device of claim 9, wherein a gap is defined between the body and the fixing plate, and the fixing plate is moveable towards the gap to be deformable along a direction perpendicular to the fixing plate.

14. The electronic device of claim 9, wherein the fixing plate is substantially perpendicular to the body.

15. The electronic device claim 9, wherein the two locking pieces are substantially perpendicular to each other.

16. The electronic device of claim 9 further comprising an operation portion, wherein the operation portion comprises a connecting piece extending from the body and a tab extending from the connecting piece, and the tab is substantially perpendicular to the connecting piece.

17. The electronic device of claim 16, wherein the operation portion further comprises a reinforcing rib, the reinforcing rib is a triangle, and two connecting sides of the reinforcing rib are connected to the body and the connecting piece.

* * * * *